(12) United States Patent
Dejugnac et al.

(10) Patent No.: US 6,246,159 B1
(45) Date of Patent: Jun. 12, 2001

(54) PIEZOSENSITIVE DEVICE COMPRISING PYROPHOSPHATE MATERIAL AND METHOD OF MAKING DEVICE

(75) Inventors: Corinne Dejugnac, La Seyne sur Mer; Michel Boisrayon, Le Beausset; Alain Scarpitta, Toulon, all of (FR)

(73) Assignee: L'Etat Francais, represente par le Delegue Ministeriel pour l'Armement, Armees (FR)

( * ) Notice: Subject to any disclaimer, the term of this patent is extended or adjusted under 35 U.S.C. 154(b) by 0 days.

(21) Appl. No.: 09/388,942

(22) Filed: Sep. 2, 1999

(30) Foreign Application Priority Data

Sep. 3, 1998 (FR) .................................................. 98 11308

(51) Int. Cl.⁷ .............................. H01L 41/18; H01L 41/22
(52) U.S. Cl. .................................................. 310/358
(58) Field of Search .................................. 310/314, 358, 310/363

(56) References Cited

U.S. PATENT DOCUMENTS

| | | | |
|---|---|---|---|
| 2,420,864 | 5/1947 | Chilowsky | 171/327 |
| 3,072,805 * | 1/1963 | Rich | 310/8.1 |
| 3,219,583 * | 11/1965 | Cook, Jr. et al. | 252/62.9 |
| 4,407,054 | 10/1983 | Zipfel, Jr. | 29/25.35 |
| 4,675,123 * | 6/1987 | Tsunooka et al. | 252/62.9 |
| 4,705,003 | 11/1987 | Yasuyuki et al. | 123/449 |
| 4,868,856 | 9/1989 | Frith et al. | 378/86 |
| 4,917,810 * | 4/1990 | Tsunooka et al. | 252/62.9 |
| 4,977,547 | 12/1990 | Giniewicz et al. | 367/157 |
| 5,169,551 * | 12/1992 | Tsunooka et al. | 252/62.9 |
| 5,786,655 | 7/1998 | Takashi et al. | 310/333 |
| 5,874,126 * | 2/1999 | Kahn et al. | 427/100 |
| 5,939,039 * | 8/1999 | Sapieszko et al. | 423/311 |
| 5,981,069 * | 11/1999 | Tani et al. | 428/403 |

FOREIGN PATENT DOCUMENTS 2 719 181    10/1995   (FR) .

* cited by examiner

Primary Examiner—Thomas M. Dougherty
(74) Attorney, Agent, or Firm—Oliff & Berridge, PLC

(57) ABSTRACT

A piezosensitive device includes a material and a device that applies a polarizing voltage to the material. Embodiments of the material are piezosensitive only when a polarizing voltage is applied to them. The device can be used, for example, in electromechanical transducers of sonar antennas.

18 Claims, 5 Drawing Sheets

PIEZOSENSITIVE DEVICE COMPRISING PYROPHOSPHATE MATERIAL AND METHOD OF MAKING DEVICE

BACKGROUND OF THE INVENTION

1. Field of Invention

The invention relates to the general field of piezoelectric ceramics and in particular to a piezosensitive device with variable, adjustable polarization. Such a device can be used, for example, in sensors of the electromechanical transducer type used in sonar antennas. These transducers can be hydrophones; accelerometers; hydrostatic, deformation, force, or temperature sensors; or complex systems that can combine these functions. These devices can also be used in the air, in microphones, accelerometers, teleprinter or computer keyboards, heat detectors, or piezochromic coatings.

As used herein, a "piezosensitive material" means a material that is sensitive to pressure and having piezoelectric and/or piezoresistive and/or piezopolar properties. Also, a "piezosensitive device" is a device that uses such a piezosensitive material.

2. Description of Related Art

Numerous piezoelectric materials exist, particularly composites, used in industry. For example, U.S. Pat. No. 2,420,864 describes a method for manufacturing a piezoelectric material having a plastic matrix and a piezoelectric monocrystal. The plastics referred to are celluloids, cellulose acetates, chlorine-containing rubbers, phenol formaldehydes, phenol-furfurol resins, acrylates, methacrylates and polystyrenes, while the monocrystals are chosen from potassium sodium tartrate, tourmaline, saccharose and tartaric acid. These materials are designed to be used solely in hydrostatic mode, namely by exposing their entire surface to the incident acoustic pressure. However, these monocrystals have very low hydrostatic constants and are hence inefficient.

Monocrystals have been gradually replaced by perovskite ceramics, particularly lead titanate zirconate or barium titanate, when high transmission powers are used. However, on reception, their hydrostatic constant is less than that of monocrystals such as lithium sulfate. Also, their application is limited to specific compression modes belonging to types 33, 31, or 32.

U.S. Pat. No. 4,977,547 describes a composite piezoelectric material made of ceramic powder and polymer. This powder is a sintered mixture of lead titanate and double iron and bismuth oxide whose average grain size is 5 microns, while the percentage by weight of double iron and bismuth oxide is between 50 and 80%.

U.S. Pat. No. 4,407,054 describes a composite piezoelectric material composed of a prepolymer such as a mixture of castor oil and ricinoleate isocyanate and a piezoelectric material such as quartz, lead titanate zirconate, tourmaline, tartaric acid, or lithium sulfate.

U.S. Pat. No. 4,868,856 describes a composite piezoelectric material composed of a polymer made from polyurethane and a piezoelectric material such as tartaric acid, a monosaccharide, a disaccharide, or a carboxylate.

Products known as "electrets," obtained by subjecting waxes, liquefied by heating, to a strong electrical field during their cooling phase, are known to have pronounced, permanent pyroelectric and piezoelectric properties.

All of the above-described materials have numerous drawbacks, particularly when used in hydrophones. Their polarization or, more generally, their piezoelectric properties are "frozen" at the time they are manufactured so that their operating mode is unique or specialized (hydrostatic mode, mode 33, 31, 15, etc.). As an example, a composite obtained by mixing grains of tartaric acid or lithium sulfate with a resin that has not yet been polymerized, then polarizing the grains by one of the known methods, can be used only in a hydrostatic mode, and its piezoelectric properties are in principle invariable, or vary slowly over time.

French Patent No. 2719181 describes a material whose polarization, and hence whose piezoelectric properties, or more generally whose piezosensitive properties, can be varied at will by applying an electrical field when the transducer containing this material, or the antenna containing the transducers using this material, are in operation.

When, for example, an antenna breaks down, a material according to the invention can be used to remedy the situation by repairing the antenna. Hence, it is not necessary to repair the receiver—something that is not always possible, or increases the cost of the receiver.

For this purpose, a device according to this invention comprises one or more piezosensitive materials made of a matrix of a polymer or a dielectric, non-piezoelectric, or slightly piezoelectric organic product, and particles, and a voltage supply for applying a polarizing voltage, whose value is adjustable, to this material or these materials.

The particles, such as fibers, powders, or fragments of objects or materials, are, as the case may be, piezoelectric, slightly piezoelectric, or even non-piezoelectric. Particles may be derived wholly, or in part, from at least one biological material or sheets or slabs of piezoelectric plastics prepolarized in the direction of their thickness or non-prepolarized, or microcrystals.

As an example, the biological material can be chosen from the oligosaccharides, homopolysaccharides, heteropolysaccharides, glycosaminoglycans, proteoglycans, terpenes, steroids, amino acids, oligopeptides and polypeptides, proteins, nucleotides, nucleic acids, urea, or natural silks.

Also, these particles may be derived wholly or in part from microcrystals or fibers of ammonium tartrate, potassium tartrate, ethylenediamine tartrate, dipotassium tartrate, sodium chlorate, sodium bromate, nickel sulfate hexahydrate, iodic acid, benzophenone, hydrated or dehydrated lithium gallate, polyvinyl difluoridene, polyvinyl chloride, a copolymer of vinyl acetate and vinylidene cyanide, a copolymer of vinylidene and trifluorethylene, polyvinyl fluoride, nylon, polyacrylonitrile, polyparaxylylene, polybichloromethyloxetane, aromatic polyamide, polysulfone, cyanoethylcellulose, monosaccharides, disaccharides, brushite, monetite, or carboxylic acid salts.

According to one preferred embodiment, the matrix of polymer or the dielectric, non-piezoelectric, or slightly piezoelectric dielectric organic product is chosen from polystyrenes, polysulfones, polycarbonates, polypropylenes, polyethylene, polyethylene terephthalates, polyphenylene oxides, polyurethane elastomers, polyvinylcarbazoles and polyvinylidene fluorides, polyacrylate or polymethacrylate esters, polyvinyl chlorides, polyvinylidenes, acrylonitrile or methacrylonitrile polymers, polyvinyl acetates, celluloids, cellulose acetates, polyvinylpyrrolidones, cellulose polymers, phenolformaldehydes, phenol-furfural resins, soluble polyimide polymers, epoxy resins, polymerizable resins, natural rubbers, synthetic rubbers, silicone resins, carbinol or bone glues, polystyrols, shellac, or vinylidene trifluorethylene copolymers.

SUMMARY OF THE INVENTION

The invention relates to a material of a different nature from those described in French Patent No. 2719181 that have piezosensitive properties. Thus, a sinusoidal voltage appears when a continuous electrical field and a force, a pressure, or a sinusoidal acceleration are applied simultaneously to the material.

The invention also relates to a piezosensitive device comprising a material and a device that applies a polarizing voltage to the material. The material is piezosensitive only when a polarizing voltage is applied to the material.

This material can comprise at least one pyrophosphate of an alkali or alkaline earth metal such as, for example, sodium pyrophosphate or a sodium and calcium pyrophosphate; the latter may have the formula $Na_2OCaOP_2O_5$.

The device that applies a polarizing voltage to this material may include any suitable voltage source, a polarizing amplifier and electrodes. The device can also comprise an adjuster that adjusts the value of the polarizing voltage.

The invention also relates to a method for manufacturing a material that can be used in a device according to the invention. An exemplary embodiment of this method comprises compacting a mixture of sodium pyrophosphate and calcium pyrophosphate powders, and heating the mixture after compacting. The compaction pressure is preferably several tens of MPa and the mixture is preferably heated at a temperature greater than about 650° C.

Using at least two devices according to the invention, a sensor can be obtained in which the combined variable-polarization piezoelectric materials function in different modes (hydrostatic, compression, shear, and bending), with the continuous or alternating polarization fields applied to cause the sensitivity of the materials to appear and corresponding to the contours or alternating polarizing voltages, having either identical directions or different directions according to the operating modes of the materials considered.

BRIEF DESCRIPTION OF THE DRAWINGS

Other advantages and characteristics of the present invention will emerge from the description of embodiments, with reference to the attached figures of which.

DETAILED DESCRIPTION OF PREFERRED EMBODIMENTS

According to the invention, a manufacturing process for a material with piezosensitive properties when a polarizing voltage is applied is provided.

Basically, the material is comprised of a mixture of sodium pyrophosphate with formula $Na_4P_2O_7$ and calcium pyrophosphate $Ca_2P_2O_7$. The two pyrophosphates can be used in the commercially available form or can be treated by one of the following processes: (a) grinding, pounding, and/or screening of monocrystals or inorganic substances sold in the form of crystal aggregates or powders; (b) ultracentrifugation of inorganic substances in the form of homogenates obtained by grinding; or (c) accelerated crystallization by mechanical, vibratory, or ultrasonic agitation of a parent solution in the case of synthetic monocrystals.

In an exemplary embodiment, the materials used are calcium and sodium pyrophosphate powders supplied by the Aldrich Company under number 32; 246-6 for $Na_4P_2O_7$. The quantity of $Na_4P_2O_7$ powder used is 0.67 grams; the quantity of $Ca_2P_2O_7$ powder used is 0.83 grams.

The calcium and sodium pyrophosphate powders are then mixed and ground in a mortar for 10 minutes. The mixture is then dried in a 200° C. oven under a pressure of $10^{-1}$ bar for 20 hours. This operation is carried out to prevent any water molecules from being adsorbed.

Figure 1:
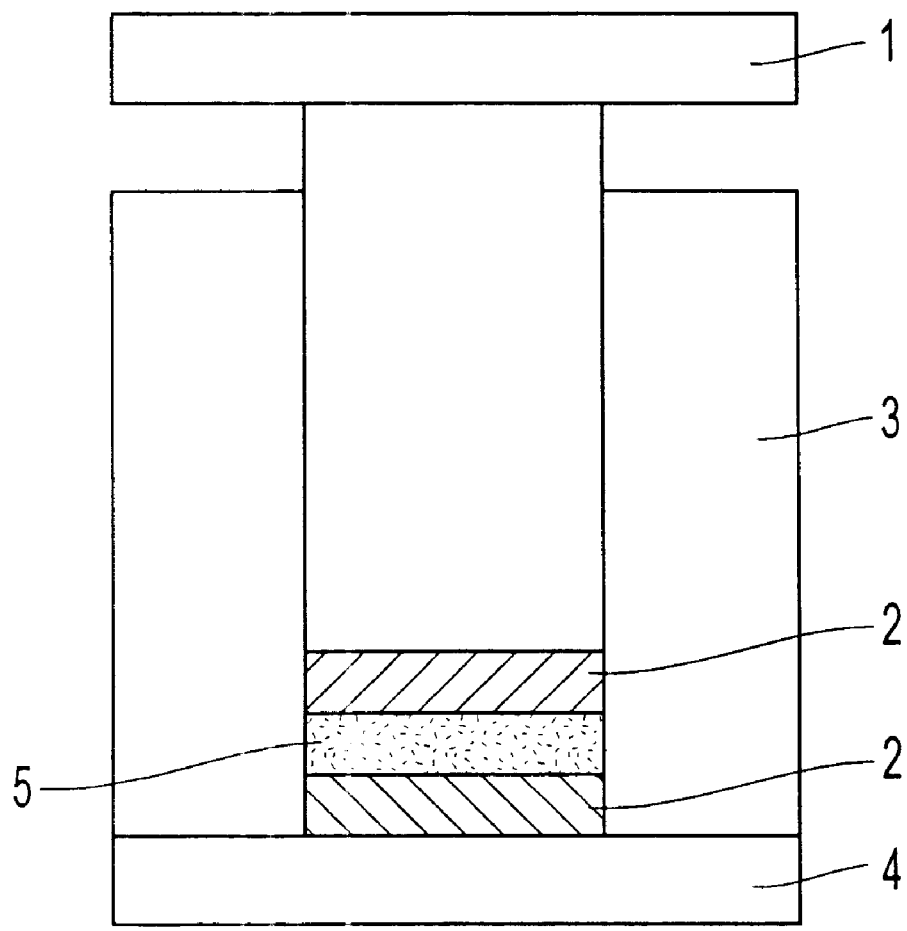
FIG. 1 shows a compacting apparatus that can be used to manufacture a piezosensitive material according to embodiments of the invention.

The mixture of calcium and sodium pyrophosphates is then placed in a mold, for example, as shown in FIG. 1, in which a pressure of 230 MPa is applied to the mixture for five minutes. This mold includes a plunger 1, two mold parts 2, a press body 3, and a base 4. This mold produces cylindrical pellets 5 that are 1.3 mm in diameter and 2 mm thick. This compacting step is carried out under a nitrogen atmosphere to keep the mixture in a dry atmosphere.

The pellet 5 thus obtained then undergoes heat treatment at 850° C. for 24 hours; the latter step is intended to ensure improved homogeneity throughout the mixture and promote cation exchanges.

The pellet 5 is then placed between two circular, plane electrodes. The outside diameter of the electrodes is 20 mm and their thickness is 3 mm.

Figure 2A:
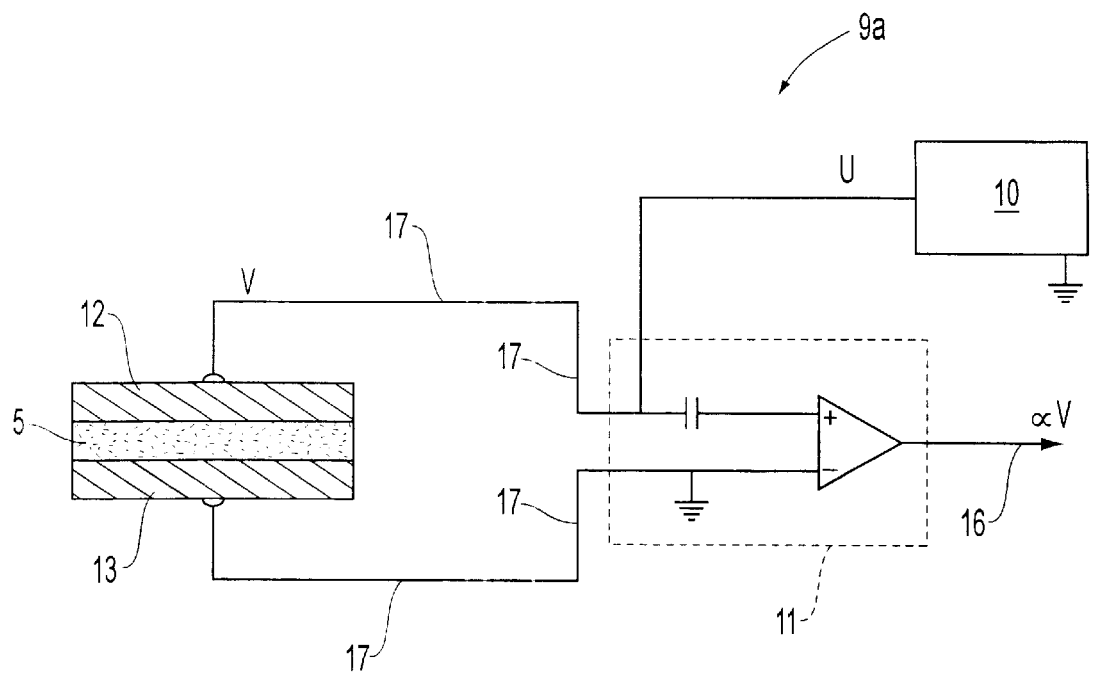
FIGS. 2(a) to 2(e) show devices suitable for applying a polarizing voltage to the materials according to the invention.
Figure 2B:
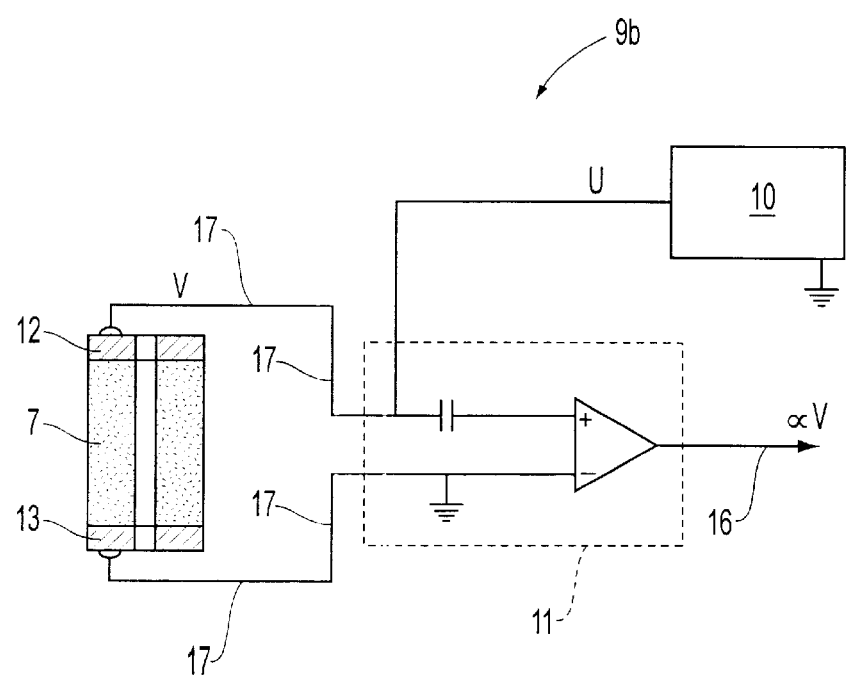

FIGS. 2(a) and 2(b) show devices 9a, 9b for applying a polarizing voltage U to disks 5 and tubes 7 made of material according to the invention. Each of these devices 9a, 9b includes a voltage source 10, a polarizing amplifier 11, and electrodes 12, 13. Each amplifier has a differential preamplifier 14.

Figure 2D:
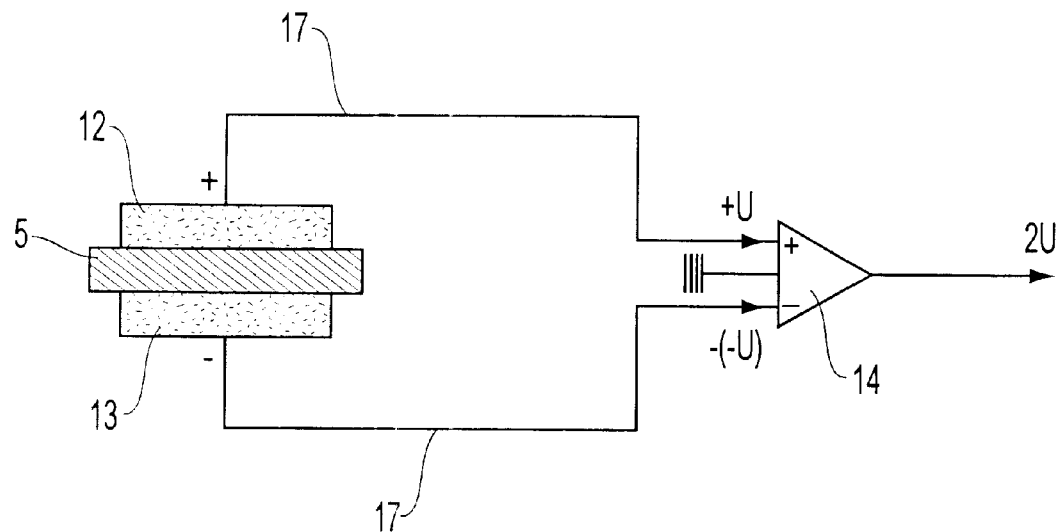
Figure 2C:
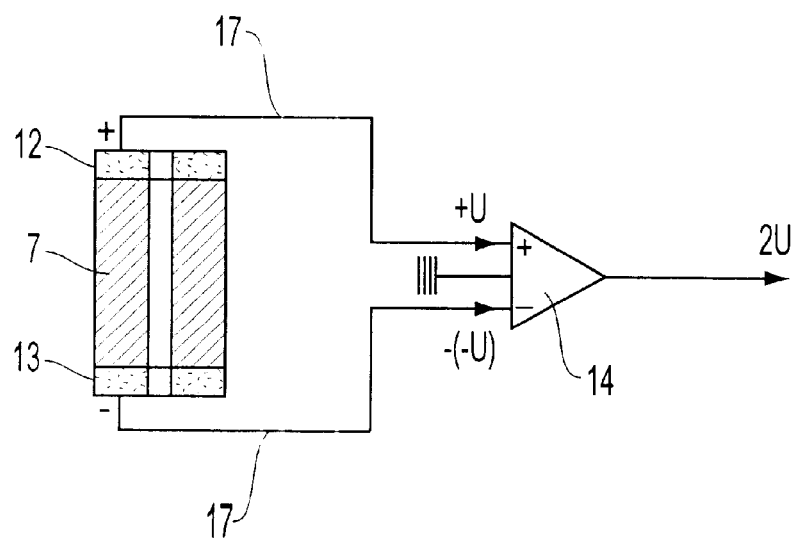

The usefulness of this type of arrangement is that tubes 7 are connected to a differential preamplifier as shown in FIG. 2(c), which enables their hydrophonic sensitivity to be fully exploited. On the other hand, because disks 5 are connected to a differential preamplifier as shown in FIG. 2(d), they function as accelerometers. Thus, the sensor has two functions.

The variable polarization applied to the sensitive elements creates a third function which is correction of dissymmetries of the sensitive elements (differences in sensitivity to acoustic pressures), as mentioned above, and correction of faults that may occur in these materials over time. Thus, a truly adaptive function can be obtained.

The polarization can be varied as desired so that defects in the symmetry of the sensitive elements can be corrected in order better to compensate for spurious accelerations.

The piezosensitive material is inserted between two metal electrodes 12, 13 that have the desired shape for the target applications. These electrodes 12, 13 are provided with two connecting wires 17 that enable the following to take place simultaneously: signal 16 delivered by the sensor is picked up when it is excited by an appropriate magnitude (acoustic pressure for a hydrophone, acceleration for an accelerometer, etc.), and the polarizing voltage coming from source 10, needed for sensor operation, is applied. The signal 16 is picked up at the output of a polarizing amplifier 11, which enables the polarization dc voltage, which can range from a few volts to 3 kV, to be separated from the low-voltage signal delivered by the sensor.

Figure 2E:
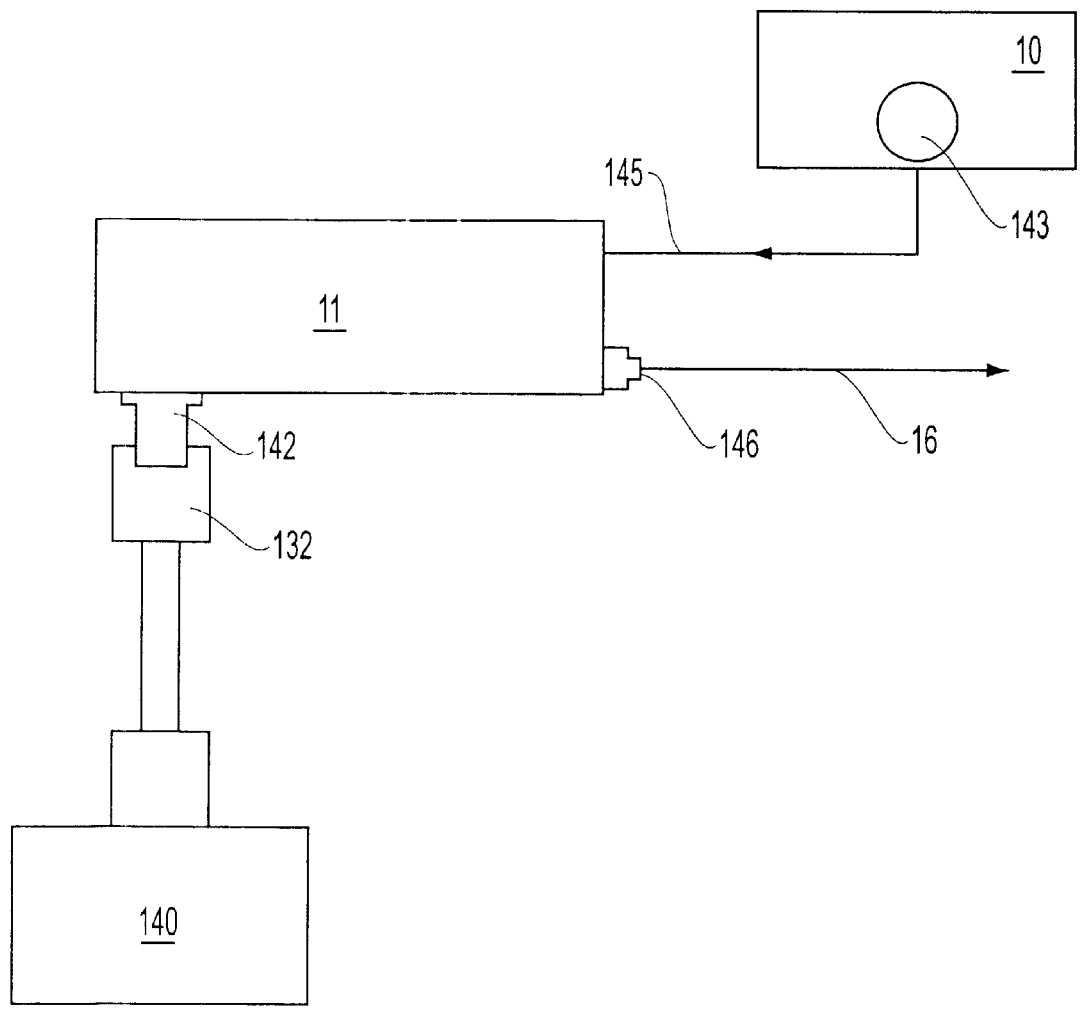

As shown in FIG. 2(e), a power socket 132 is connected to an assembly 140 comprised of electrodes 12, 13 and piezosensitive material 5, and to a polarizing amplifier 11, in the form of a cabinet, which is provided with a coaxial base 142 so that the signal delivered by the hydrophone can be picked up and at the same time subjected to a dc polarizing voltage.

This voltage can vary as a function of the desired sensitivity from 0 V to 2 kV. It is adjusted by a potentiometer 143.

Polarizing amplifier 11 is connected to a dc voltage source 10 by a cable 145. Cable 145 is connected directly to the interior of the cabinet and the latter is provided with a power socket 146 so that it can pick up the low-voltage signal delivered by the hydrophone and amplified in this cabinet.

EXAMPLES

Figure 3A:
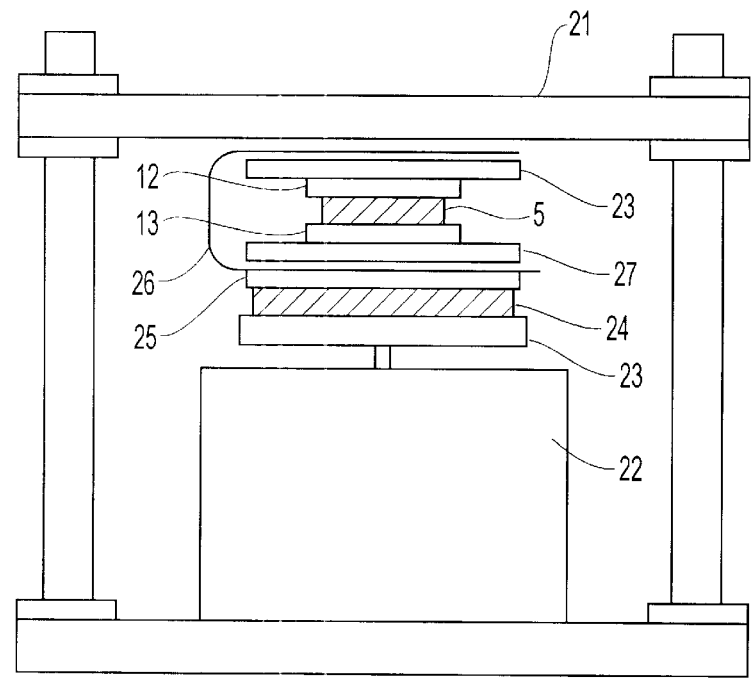
FIGS. 3(a) and 3(b) show devices for testing the materials subjected to accelerations.
Figure 3B:
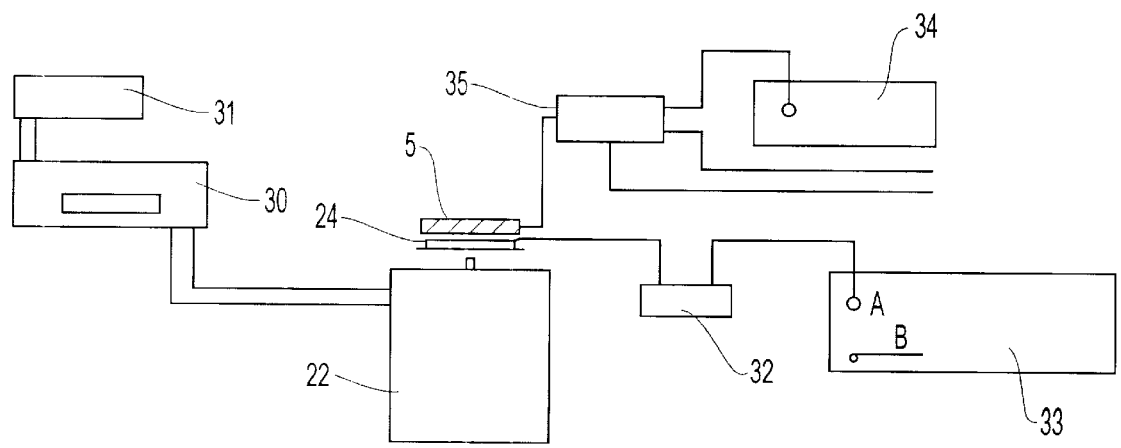

To compare the performances of a material according to the invention with conventional materials, such as ceramics, and with the basic pyrophosphates taken individually, a pellet of each of the materials plus its electrodes were placed in a shaker as shown in FIGS. 3(a) and 3(b).

FIG. 3a shows a testing device including a frame made of cadmium-plated steel on which a type 4809 Bruel and Kjaer shaker 21 is placed. An aluminum base 22 with a diameter of 90 mm and a thickness of 5 mm is placed on this shaker. On this base 22 are placed an electroded porous ceramic 23 having dimensions 76 mm×87 mm×5 mm, then an electrically insulating polyvinyl chloride slab 24, then the end of a sheet of electrically insulating polyvinyl 25, then the end of a copper strip 25, a second insulating polyvinyl chloride slab 27, then a pellet 5 sandwiched between two electrodes 12, 13, then a third insulating polyvinyl chloride slab 28, and finally the second end of copper strip 26.

The measurements of sensitivity to acceleration of the materials compared are made using the device shown in FIG. 3(b).

Shaker 21 is excited by a type 201 S-B frequency generator 30 (Adret Electronique) coupled to a power amplifier 31 whose characteristics are 60 W, 20 Hz/20 kHz.

The signal restored by the ceramic passes through a preamplifier 32 with gain 10 dB and is then recovered and displayed on an oscilloscope 33. This signal serves as a reference. Pellet 5 is excited by the high voltage produced by a voltage generator 34. The electronic signal is restored by a preamplifier 35, gain 20 dBV, then recovered on oscilloscope 33.

The following TABLE 1 and TABLE 2 show the voltage delivered by the material and displayed on oscilloscope 33 when the material is subjected to the accelerations of shaker 21 under the conditions described above. The measurements were made for four frequency values (300 Hz, 500 Hz, 800 Hz, and 1000 Hz) with and without an applied dc voltage.

The materials tested, called NC95 and NC80, are materials according to the invention with 95% and 80% sodium pyrophosphate respectively. To prepare them, they are mixed and the sodium and calcium pyrophosphate powders are mixed and ground in the following proportions $(Na_4P_2O_7)_x(Ca_2P_2O_7)_{1-x}$ with x=0.936 in the first case and x=0.755 in the second.

The mixture is then dried at 200° C. for 20 hours, then compacted into a pellet at a pressure of 2.2 kbar, and finally heated without air at 850° C. for 24 hours.

TABLE 1

|  | 300 Hz | 500 Hz | 800 Hz | 1000 Hz |
| --- | --- | --- | --- | --- |
| Ceramic | 880 mV | 460 mV | 580 mV | 580 Mv |
| NC95 | — | — | — | — |
| NC80 | — | — | — | — |
| $Ca_2P_2O_7$ | — | — | — | — |
| $Na_4P_2O_7$ | 20 mV | — | — | — |

TABLE 1 shows that, without application of a polarizing voltage, the materials according to the invention, as well as calcium pyrophosphate, have no sensitivity to accelerations. In other words, without application of a polarizing voltage, they do not have piezosensitive characteristics.

Sodium pyrophosphate, on the other hand, has very low sensitivity at the frequency of 300 Hz (20 mV) and the ceramic has a natural piezosensitivity at all the frequencies tested.

TABLE 2

|  | 300 Hz | 500 Hz | 800 Hz | 1000 Hz |
| --- | --- | --- | --- | --- |
| Ceramic | 900 mV | 480 mV | 540 mV | 520 mV |
| NC95 | 5.28 V | 2.8 V | 1.8 V | 2.08 V |
| NC80 | 3.6 V | 1.28 V | 480 mV | 640 mV |
| Ceramic | 920 mV | 540 mV | 480 mV | 540 mV |
| $Ca_2P_2O_7$ | 640 mV | 280 mV | 300 mV | 360 mV |
| ceramic | 880 mV | 460 mV | 580 mV | 600 mV |
| $Na_4P_2O_7$ | 3.5 V | 880 mV | 400 mV | 400 mV |

TABLE 2 shows the test results for the application of a polarizing voltage to the materials according to the invention. As shown, the applied polarizing voltage gives the materials according to the invention far higher piezosensitivity than that of the ceramics, and also higher piezosensitivity than that of the sodium and calcium pyrophosphates taken separately.

Numerous modifications may be made without departing from the scope of the invention.

Thus, it may be noted that the heating temperature of the mixture of sodium and potassium pyrophosphates may for example be 850° C. for the samples rich in $Na_4P_2O_7$ or $Ca_2P_2O_7$, because it corresponds to a domain of coexistence of α-$Ca_2P_2O_7$ and liquid containing calcium and sodium in the first case, and α-$Ca_2P_2O_7$ and liquid containing calcium and sodium in the second case.

The samples located in the middle of the phase diagram of the $Na_2OCaOP_2O_5$ system are close to a eutectic and the heating temperature may be approximately 700° C.

The annealing effect will depend on the heating temperature.

Moreover, the polarizing voltage applied to the material according to the invention may be an ac or a dc voltage.

What is claimed is:

1. A piezosensitive device, comprising:
 a solid material comprising at least one pyrophosphate of an alkali or alkaline earth metal; and
 a device that applies a polarizing voltage to the material.
2. The piezosensitive device according to claim 1, wherein the material comprises sodium pyrophosphate.
3. The piezosensitive device according to claim 1, wherein the material comprises a sodium and calcium pyrophosphate.
4. An electromechanical transducer comprising the piezosensitive device according to claim 1.

5. The piezosensitive device according to claim 1, wherein the material is piezosensitive only when a polarizing voltage is applied to the material.

6. The piezosensitive device according to claim 1, wherein the device that applies a polarizing voltage to the material comprises a voltage source, a polarizing amplifier, and electrodes.

7. The piezosensitive device according to claim 6, wherein the device that applies a polarizing voltage includes a regulator that regulates the polarizing voltage.

8. The piezosensitive device according to claim 1, wherein the device that applies a polarizing voltage applies a dc voltage or an ac voltage to the material.

9. A piezosensitive device, comprising:
   a material comprising a sodium and calcium pyrophosphate having a formula $Na_2OCaOP_2O_5$; and
   a device that applies a polarizing voltage to the material.

10. A method of manufacturing a piezosensitive device, comprising:
    compacting a material comprising at least one pyrophosphate of an alkali or alkaline earth metal;
    heating the compacted material to form a solid material; and
    making a piezosensitive device comprising the solid material and a device that applies a polarizing voltage to the solid material.

11. The method according to claim 10, wherein the material comprises sodium pyrophosphate.

12. The method according to claim 10, wherein the material comprises a sodium and calcium pyrophosphate.

13. The method according to claim 10, wherein the material comprises a sodium and calcium pyrophosphate having a formula $Na_2OCaOP_2O_5$.

14. The method according to claim 10, wherein the material is piezosensitive only when a polarizing voltage is applied to the material.

15. The method according to claim 10, wherein the material is compacted at a pressure of several tens of MPa.

16. The method according to claim 10, wherein the material is heated to a temperature of at least about 650° C.

17. A piezosensitive device, comprising:
    a material comprising a mixture of at least two pyrophosphates of an alkali or alkaline earth metal; and
    a device that applies a polarizing voltage to the material.

18. A piezosensitive device, comprising:
    a material consisting essentially of at least one pyrophosphate of an alkali or alkaline earth metal; and
    a device that applies a polarizing voltage to the material.

* * * * *